(12) United States Patent
Komiya

(10) Patent No.: US 11,901,251 B2
(45) Date of Patent: *Feb. 13, 2024

(54) SEMICONDUCTOR DEVICE HAVING ELECTRODE PADS ARRANGED BETWEEN GROUPS OF EXTERNAL ELECTRODES

(71) Applicant: ROHM CO., LTD., Kyoto (JP)

(72) Inventor: Kunihiro Komiya, Kyoto (JP)

(73) Assignee: ROHM CO., LTD, Ukyo-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/854,316

(22) Filed: Jun. 30, 2022

(65) Prior Publication Data

US 2022/0336305 A1 Oct. 20, 2022

Related U.S. Application Data

(63) Continuation of application No. 16/855,281, filed on Apr. 22, 2020, now Pat. No. 11,410,900, which is a
(Continued)

(30) Foreign Application Priority Data

Sep. 29, 2004 (JP) ................................ 2004-283167

(51) Int. Cl.
*H01L 23/31* (2006.01)
*H01L 23/00* (2006.01)
(Continued)

(52) U.S. Cl.
CPC .......... *H01L 23/3114* (2013.01); *H01L 23/50* (2013.01); *H01L 23/528* (2013.01);
(Continued)

(58) Field of Classification Search
CPC ... H01L 23/3114; H01L 23/50; H01L 23/528; H01L 23/53214; H01L 23/53228;
(Continued)

(56) References Cited

U.S. PATENT DOCUMENTS 5,656,550 A 8/1997 Tsuji et al.
5,925,931 A 7/1999 Yamamoto
(Continued)

FOREIGN PATENT DOCUMENTS

JP 2003297961 A 10/2003

OTHER PUBLICATIONS

U.S. Notice of Allowance for corresponding U.S. Appl. No. 16/855,281; dated Mar. 31, 2022.
(Continued)

*Primary Examiner* — Nathan W Ha
(74) *Attorney, Agent, or Firm* — CANTOR COLBURN LLP

(57) ABSTRACT

The semiconductor device has the CSP structure and may include a plurality of electrode pads formed on a semiconductor integrated circuit in order to input/output signals from/to exterior; solder bumps for making external lead electrodes; and rewiring. The solder bumps may be arranged in two rows along the periphery of the semiconductor device. The electrode pads may be arranged inside the outermost solder bumps so as to be interposed between the two rows of solder bumps. Each trace of the rewiring may be extended from an electrode pad and may be connected to any one of the outermost solder bumps or any one of the inner solder bumps.

18 Claims, 5 Drawing Sheets

Related U.S. Application Data continuation of application No. 16/161,561, filed on Oct. 16, 2018, now Pat. No. 10,665,518, which is a continuation of application No. 15/609,541, filed on May 31, 2017, now Pat. No. 10,134,653, which is a continuation of application No. 15/177,921, filed on Jun. 9, 2016, now Pat. No. 9,691,678, which is a continuation of application No. 14/658,835, filed on Mar. 16, 2015, now Pat. No. 9,391,033, which is a continuation of application No. 14/149,138, filed on Jan. 7, 2014, now Pat. No. 9,006,885, which is a continuation of application No. 13/774,213, filed on Feb. 22, 2013, now Pat. No. 8,653,656, which is a continuation of application No. 13/365,591, filed on Feb. 3, 2012, now Pat. No. 8,405,208, which is a continuation of application No. 12/939,642, filed on Nov. 4, 2010, now Pat. No. 8,134,238, which is a continuation of application No. 11/972,950, filed on Jan. 11, 2008, now Pat. No. 7,851,929, which is a continuation of application No. 11/238,189, filed on Sep. 29, 2005, now Pat. No. 7,342,312.

(51) Int. Cl.
  H01L 23/50 (2006.01)
  H01L 23/528 (2006.01)
  H01L 23/532 (2006.01)

(52) U.S. Cl.
  CPC .. *H01L 23/53214* (2013.01); *H01L 23/53228* (2013.01); *H01L 23/53242* (2013.01); *H01L 24/06* (2013.01); *H01L 24/10* (2013.01); *H01L 24/13* (2013.01); *H01L 24/14* (2013.01); H01L 2224/0401 (2013.01); H01L 2224/05124 (2013.01); H01L 2224/05144 (2013.01); H01L 2224/05147 (2013.01); H01L 2224/05644 (2013.01); H01L 2224/05647 (2013.01); H01L 2224/0612 (2013.01); H01L 2224/13 (2013.01); H01L 2224/13023 (2013.01); H01L 2224/13025 (2013.01); H01L 2224/13099 (2013.01); H01L 2224/1413 (2013.01); H01L 2224/14104 (2013.01); H01L 2924/014 (2013.01); H01L 2924/01005 (2013.01); H01L 2924/01006 (2013.01); H01L 2924/01013 (2013.01); H01L 2924/01029 (2013.01); H01L 2924/01033 (2013.01); H01L 2924/01079 (2013.01); H01L 2924/01082 (2013.01); H01L 2924/14 (2013.01); H01L 2924/19041 (2013.01); H01L 2924/30107 (2013.01)

(58) Field of Classification Search
  CPC ... H01L 23/53242; H01L 24/06; H01L 24/10; H01L 24/13; H01L 24/14
  See application file for complete search history.

(56) References Cited

U.S. PATENT DOCUMENTS

| | | | |
|---|---|---|---|
| 5,959,846 A | 9/1999 | Noguchi et al. | |
| 6,022,792 A | 2/2000 | Ishii et al. | |
| 6,150,194 A | 11/2000 | Sakaguchi et al. | |
| 6,166,442 A | 12/2000 | Nakamura | |
| 6,218,202 B1 | 4/2001 | Yew et al. | |
| 6,285,079 B1 | 9/2001 | Kunikiyo | |
| 6,300,234 B1* | 10/2001 | Flynn | H01L 24/11 257/E23.161 |
| 6,674,163 B1 | 1/2004 | Andoh | |
| 6,674,174 B2 | 1/2004 | Chungpaiboonpatana et al. | |
| 6,678,028 B2 | 1/2004 | Yamate et al. | |
| 7,071,561 B2 | 7/2006 | Chen | |
| 7,342,312 B2 | 3/2008 | Komiya | |
| 7,663,235 B2 | 2/2010 | Lu et al. | |
| 7,745,930 B2 | 6/2010 | Connah et al. | |
| 7,777,332 B2 | 8/2010 | Hashimoto | |
| 7,968,916 B2 | 7/2011 | Anderson et al. | |
| 7,977,774 B2 | 7/2011 | Choi et al. | |
| 7,985,661 B2 | 7/2011 | Grivna | |
| 7,986,045 B2 | 7/2011 | Maebashi et al. | |
| 7,988,808 B2 | 8/2011 | Lu et al. | |
| 8,405,208 B2 | 3/2013 | Komiya | |
| 11,410,900 B2* | 8/2022 | Komiya | H01L 23/53214 |
| 2001/0050423 A1 | 12/2001 | Kariyazaki | |
| 2002/0063340 A1 | 5/2002 | Sahara et al. | |
| 2002/0185661 A1 | 12/2002 | Kawanobe et al. | |
| 2004/0026773 A1* | 2/2004 | Koon | H01L 23/49551 257/E23.047 |
| 2004/0041271 A1 | 3/2004 | Storli | |
| 2004/0130022 A1 | 7/2004 | Shizuno | |
| 2004/0150104 A1* | 8/2004 | Terui | H01L 23/3114 257/734 |
| 2004/0155351 A1* | 8/2004 | Miyamoto | H01L 24/13 257/E21.526 |
| 2004/0155360 A1* | 8/2004 | Akram | H01L 24/97 257/784 |
| 2004/0159921 A1* | 8/2004 | Moxham | H01L 23/49833 257/772 |
| 2004/0159957 A1* | 8/2004 | Lee | H01L 24/28 257/E21.503 |
| 2004/0188819 A1 | 9/2004 | Farnworth et al. | |
| 2004/0188857 A1 | 9/2004 | Ohnishi et al. | |
| 2004/0239439 A1 | 12/2004 | Aoki et al. | |
| 2005/0006760 A1 | 1/2005 | Terui | |
| 2005/0098891 A1 | 5/2005 | Wakabayashi et al. | |
| 2005/0186708 A1 | 8/2005 | Yamada | |
| 2006/0163728 A1 | 7/2006 | Nakanishi et al. | |
| 2006/0180942 A1 | 8/2006 | Kuroda et al. | |
| 2006/0180943 A1 | 8/2006 | Miwa et al. | |
| 2006/0214189 A1 | 9/2006 | Chen | |
| 2009/0206490 A1 | 8/2009 | Koide et al. | |
| 2011/0298127 A1 | 12/2011 | Seta et al. | |
| 2012/0104625 A1 | 5/2012 | Park et al. | |
| 2013/0211776 A1 | 8/2013 | Grivna | |
| 2014/0061900 A1 | 3/2014 | Park et al. | |

OTHER PUBLICATIONS

U.S. Non-Final Office Action doe corresponding U.S. Appl. No. 15/609,541; dated, Feb. 21, 2018.
U.S. Non-Final Office Action for corresponding U.S. Appl. No. 14/658,835; dated, Oct. 6, 2015.
U.S. Non-Final Office Action for corresponding U.S. Appl. No. 15/177,921; dated Oct. 3, 2016.
U.S. Non-Final Office Action for corresponding U.S. Appl. No. 16/855,281; dated Aug. 5, 2021.
U.S. Non-Final Office Action for corresponding U.S. Appl. No. 16/161,561; dated Sep. 6, 2019.

* cited by examiner

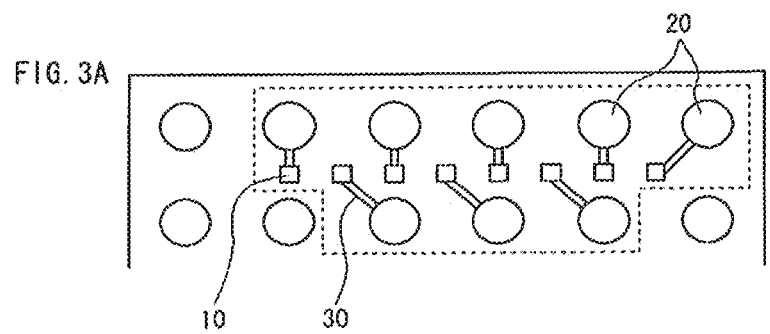
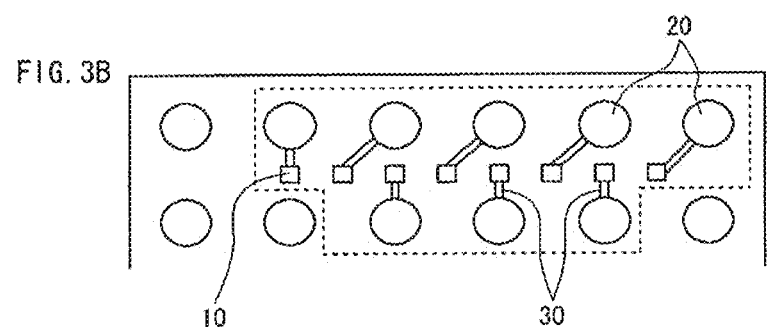
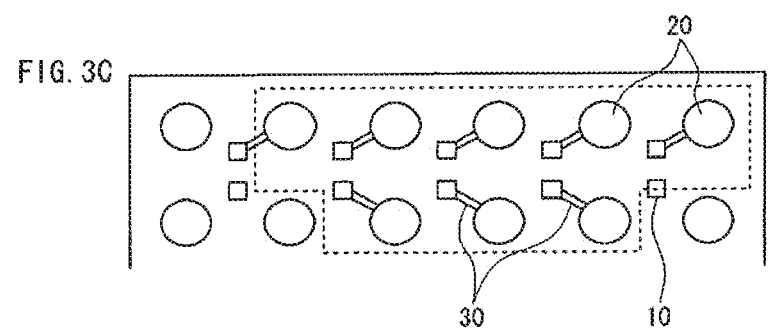
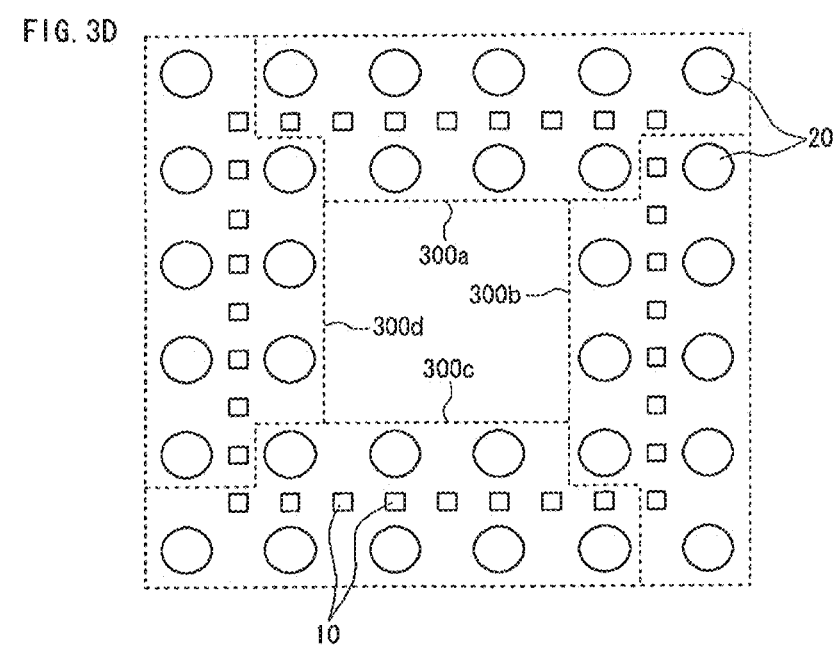

SEMICONDUCTOR DEVICE HAVING ELECTRODE PADS ARRANGED BETWEEN GROUPS OF EXTERNAL ELECTRODES

CROSS REFERENCE TO RELATED APPLICATION

The present application is a continuation of U.S. application Ser. No. 16/855,281, filed on Apr. 22, 2020, which is incorporated herein by reference. The Ser. No. 16/855,281 application is a continuation of U.S. application Ser. No. 16/161,561, filed on Oct. 16, 2018. The Ser. No. 16/161,561 application is a continuation application of U.S. application Ser. No. 15/609,541, filed on May 31, 2017, which is incorporated herein by reference. The Ser. No. 15/609,541 application is a continuation application of U.S. application Ser. No. 15/177,921, filed on Jun. 9, 2016, which is incorporated herein by reference. The Ser. No. 15/177,921 application is a continuation application of U.S. application Ser. No. 14/658,835, filed on Mar. 16, 2015, which is incorporated herein by reference. The Ser. No. 14/658,835 application is a continuation application of U.S. application Ser. No. 14/149,138, filed on Jan. 7, 2014, which is incorporated herein by reference. The Ser. No. 14/149,138 application is a continuation application of U.S. application Ser. No. 13/774,213, filed on Feb. 22, 2013, which is incorporated herein by reference. The Ser. No. 13/774,213 application is a continuation application of U.S. application Ser. No. 13/365,591, filed on Feb. 3, 2012, which is incorporated herein by reference. The Ser. No. 13/365,591 application is a continuation application of U.S. application Ser. No. 12/939,642, filed on Nov. 4, 2010, which is incorporated herein by reference. The Ser. No. 12/939,642 application is a continuation application of U.S. application Ser. No. 11/972,950, filed on Jan. 11, 2008, which is incorporated herein by reference. The Ser. No. 11/972,950 application is a continuation application of U.S. application Ser. No. 11/238,189, filed on Sep. 29, 2005, which is incorporated herein by reference. The Ser. No. 11/238,189 application claimed priority under 35 U.S.C. § 119(a) to Japanese Application No. 2004-283167, filed Sep. 29, 2004. The present application likewise claims priority under 35 U.S.C. § 119 to Japanese Application No. 2004-283167, filed Sep. 29, 2004, the entire content of which is also incorporated herein by reference.

FIELD OF THE INVENTION

The invention relates to a semiconductor device, and more particularly to a semiconductor device having a chip size package (hereinafter, referred to as CSP) structure.

DESCRIPTION OF THE RELATED ART

With the recent miniaturization of information terminals such as a cellular phone and a personal digital assistance (PDA), miniaturization of semiconductor devices to be used inside, such as LSIs, has been in increasing demand. Under such circumstances, attention has been given to a packaging technology called ball grid array (BGA) structure.

Unlike conventional quad flat package (QFP) structures in which lead frames are used to connect semiconductor devices to a substrate, the BGA structure achieves substrate connection via terminals called solder bumps or solder balls which are formed on the surfaces of the semiconductor devices. According to this BGA structure, external connection terminals can be formed over the entire surfaces of semiconductor devices. This can eliminate the need for lead frames around the components, allowing a significant reduction in packaging area.

By using this BGA structure, there has been developed a packaging technology called chip size package (CSP), in which the area of a semiconductor chip and the packaging area of the same are approximately equal. There has also been developed a technology called wafer level CSP (WL-CSP), in which solder bumps are formed directly on semiconductor chips without any substrate. This promotes the miniaturization of semiconductor devices (see Japanese Patent Laid-Open Publication No. 2003-297961).

A semiconductor device to which this CSP technology is applied has external connection terminals made of solder bumps, which are often arranged systematically on the surface of the semiconductor device for the sake of connection with a printed-circuit board as shown in FIG. 1 of the above-mentioned patent document.

Meanwhile, given a semiconductor substrate having a semiconductor integrated circuit formed thereon, electrode pads intended for signal input and output are often arranged along the periphery of the semiconductor integrated circuit as is the case with the QFP structure. The electrode pads formed on the periphery of this semiconductor integrated circuit are routed by a rewiring layer to the positions of systematically-arranged solder bumps for the sake of electric connection.

Under the circumstances, the inventor has become aware of the following problem. FIG. 5 shows an example of the layout of electrode pads and solder bumps on a semiconductor device 500 having the CSP structure, showing the problem of the present invention. Electrode pads 10 are arranged along the periphery of the semiconductor device 500. Solder bumps 20, or external lead electrodes, are also arranged systematically on the semiconductor device 500. Rewiring 30 routes signals from the positions of the electrode pads 10 to the positions of the solder bumps 20, or external lead electrodes, for respective electric connections. As in FIG. 1 of the patent document, the solder bumps 20 are arranged on this semiconductor device 500 inside the electrode pads 10.

Now, focus attention on the electrode pads 10a and 10b, and the solder bumps 20a to 20d. The electrode pads 10a and 10b are connected to the inner solder bumps 20a and 20b, respectively, out of the solder bumps arranged in two rows. In this case, rewiring traces 30a and 30b must be laid so as to pass between the solder bumps 20c and 20d.

As a result, the rewiring traces 30a and 30b have greater lengths than that of a rewiring trace 30c to be connected with the outer solder bump 20c. This causes differences in the rewiring length, which can adversely affect circuit characteristics including resistances and inductances.

In order to lower these resistances and inductances, it might be desired to put the solder bumps 20 closer to the chip edges. Nevertheless, the distance between a chip edge and a solder bump 20, designated by d in the diagram, is restricted by the rewiring. The reason is that the distances from the rewiring traces to the respective electrode pads and solder bumps must be rendered greater than a predetermined distance which is determined by design rules on the semiconductor manufacturing process of the semiconductor device 500. For example, trying to put the solder bump 20c closer to the chip edge of the semiconductor device 500 has limitations since the rewiring trace 30a and the solder bump 20c, and the rewiring trace 30a and the electrode pad 10b, must be spaced wider than a certain distance determined by the design rules.

Consequently, useless gaps required for the rewiring layout appear on the periphery of the semiconductor device 500 outside the solder bumps 20. There has thus been the problem of an increased chip size.

SUMMARY OF THE INVENTION

One of the aspects of the present invention relates to a semiconductor device. This semiconductor device comprises: a semiconductor substrate having an integrated circuit formed thereon; a plurality of electrode pads formed on the semiconductor substrate, being intended for input and output of signals between the integrated circuit and an external circuit; and a plurality of external electrodes connected to the plurality of electrode pads via rewiring, the external electrodes making connection terminals for the external circuit. The plurality of external electrodes includes a first group of external electrodes arranged along an edge of the semiconductor substrate and a second group of external electrodes arranged inside the first group of external electrodes. The plurality of electrode pads is arranged between the first group of external electrodes and the second group of external electrodes, and are each connected to an external electrode included in either the first group of external electrodes or the second group of external electrodes via the rewiring.

The "electrode pads intended for input and output of signals between the integrated circuit and the external circuit" refer to electrode pads that supply signals to, lead out signals from, or ground or otherwise treat the circuit elements constituting the integrated circuit. The "external electrodes" refer to electrodes that function as terminals for connecting to the external circuit, such solder bumps, solder balls, or posts.

According to this aspect, the plurality of electrode pads is arranged between the first group of external electrodes and the second group of external electrodes. Consequently, the external electrodes included in either of the groups can be connected by approximately the same distances of rewiring. Since the lengths of the rewiring traces have an impact on the wiring resistances and inductances, it is possible to suppress variations in the electric characteristics. In addition, since the rewiring need not be routed outside the first group of external electrodes, it is possible to put the first group of external electrodes closer to the outer edges of the semiconductor device without constraints from the layout of the rewiring. This can suppress an increase in chip size.

The integrated circuit may include input/output circuits to be connected to the plurality of electrode pads, being arranged on an outermost periphery of the semiconductor device; and a functional circuit arranged near the center of the semiconductor substrate. The plurality of electrode pads may be arranged between the input/output circuits and the functional circuit.

The "input/output circuits" refer to protective elements which are connected with the respective electrode pads and protect internal circuit elements, and circuits which have a predetermined circuit configuration and size, such as an input/output buffer. Since the input/output circuits are disposed to the space above the integrated circuit, appearing outside the electrode pads, it is possible to improve the use efficiency of space. This allows a further reduction in chip size.

The plurality of electrode pads may have a minimum spacing generally equivalent to an integral multiple of the minimum spacing of the plurality of external electrodes.

With twice the spacing in particular, two adjoining external electrodes out of the first group of external electrodes and two out of the second group of external electrodes are located near respective corresponding four electrode pads. This allows economic, efficient rewiring.

The first and second groups of external electrodes may be arranged systematically at regular intervals. The systematic arrangement of the external electrodes facilitates determining the layout of the electrode pads and the rewiring.

The semiconductor device may further include an insulating film formed over the electrode pads, the insulating film having openings at locations above the electrode pads. The rewiring may be formed on this insulating film.

Another aspect of the present invention is also a semiconductor device. This semiconductor device comprises: a semiconductor substrate having an integrated circuit formed thereon; a plurality of electrode pads formed on the semiconductor substrate, being intended for input and output of signals between the integrated circuit and an external circuit; and a plurality of external electrodes connected to the plurality of electrode pads via rewiring, the external electrodes making connection terminals for the external circuit. The plurality of external electrodes includes a first row of group of external electrodes arranged linearly, and a second row of group of external electrodes arranged linearly in parallel with the first row of group of external electrodes. Some of the plurality of electrode pads are located in an area interposed between the first and second rows of groups of external electrodes and are each connected to one of the external electrodes in either the first or second row of group of external electrodes by means of the rewiring.

According to this aspect, the electrode pads are located in the area interposed between the external electrodes which are arranged in two parallel rows. The connections to the two rows can thus be made by almost the same distances of rewiring.

The plurality of electrode pads may be arranged linearly in parallel with the first and second rows of groups of external electrodes. Since the plurality of electrode pads are arranged linearly, the external electrodes and the electrode pads are situated in parallel with each other. This can simplify the rewiring connections.

The first row of group of external electrodes, the second row of group of external electrodes, and the plurality of electrode pads may be arranged systematically at regular intervals. The systematic arrangement of these also results in systematic layout of the rewiring. The rewiring connections can thus be simplified further.

The first or second row of group of external electrodes may have a minimum spacing generally equivalent to an integral multiple of the minimum spacing of the plurality of electrode pads.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3A to FIG. 3D are plan views of the semiconductor device according to a second embodiment, showing part of the layout of electrode pads, solder bumps, and rewiring;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
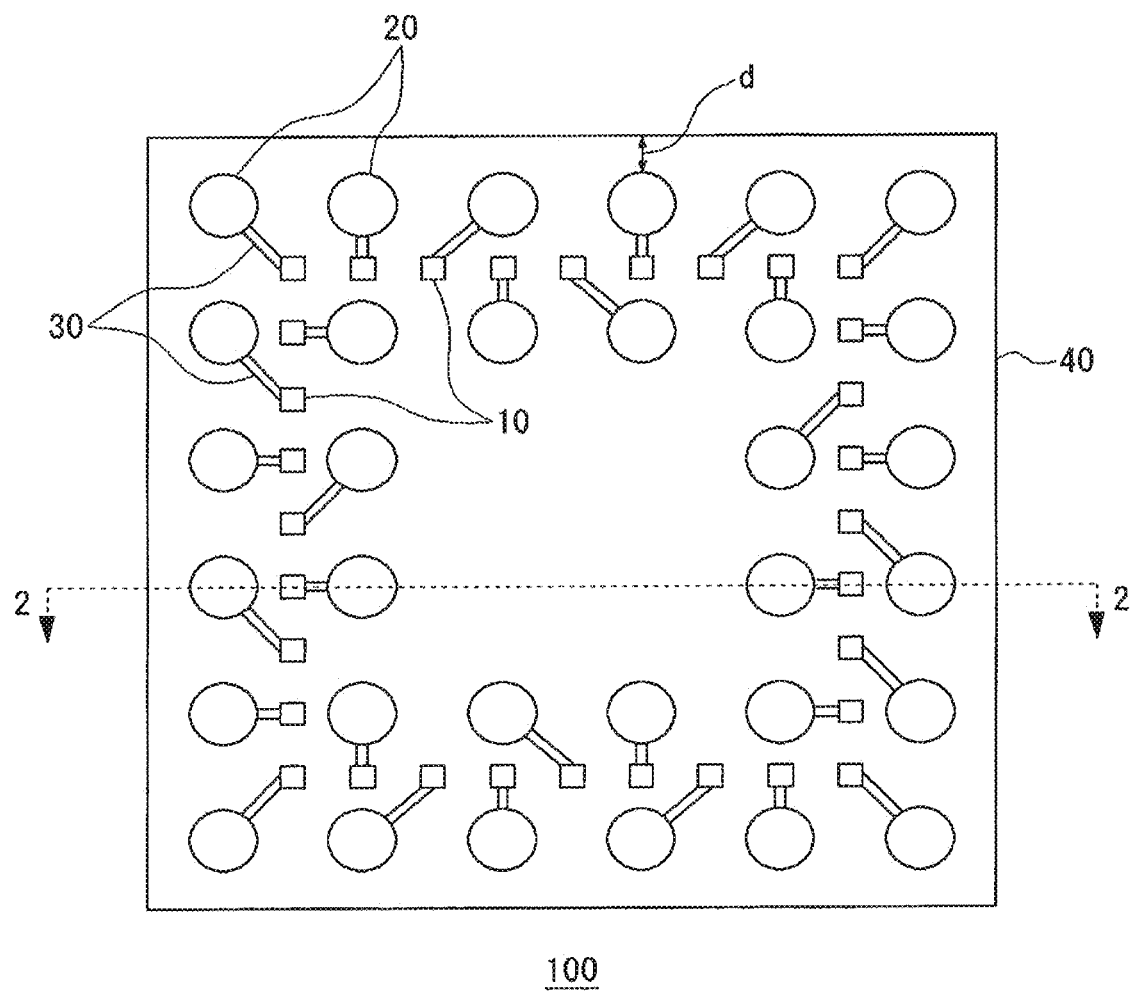
FIG. 1 is a plan view of a semiconductor device according to a first embodiment.

FIG. 1 is a diagram showing a semiconductor device 100 according to an embodiment of the present invention, as viewed from the electrode-pad side. The semiconductor device 100 has a CSP structure. In the diagram, the semiconductor device 100 includes: a plurality of electrode pads 10 for inputting and outputting signals from/to exterior; solder bumps 20 for making external lead electrodes; and rewiring 30.

Figure 2:
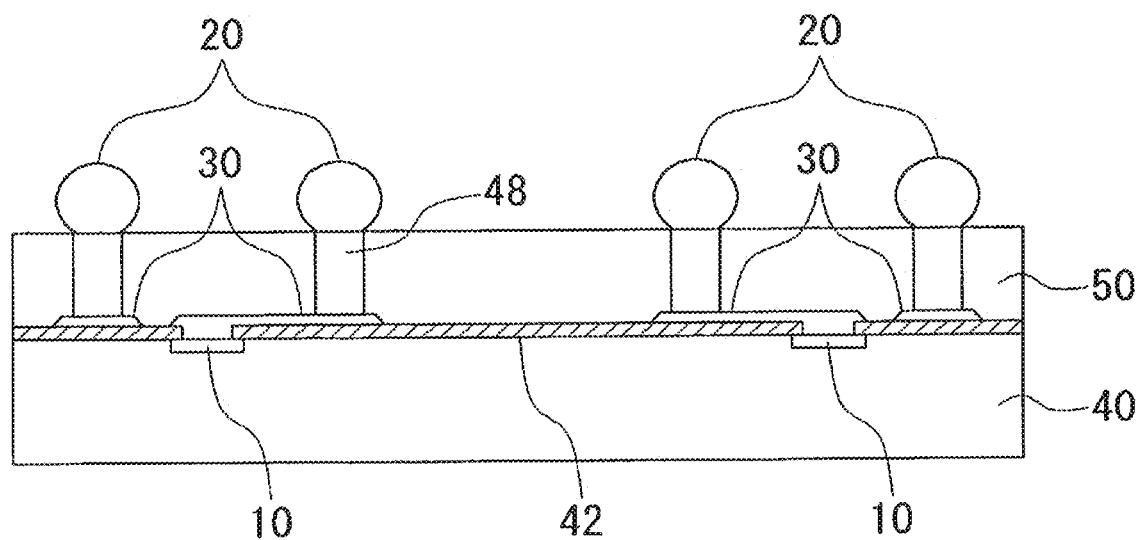
FIG. 2 is a sectional view taken along the line 2-2 of FIG. 1.

FIG. 2 is a sectional view taken along the line 2-2 of FIG. 1. This semiconductor device 100 has the WL-CSP structure in which external connection electrodes are formed directly on its semiconductor substrate 40. The semiconductor device 100 includes the semiconductor substrate 40, a protective film 42 for passivation, the electrode pads 10, the rewiring 30, posts 48, the solder bumps 20, and a sealing resin 50. Semiconductor integrated circuits including such devices as a transistor are formed on the top of the semiconductor substrate 40 and are provided with the electrode pads 10 intended for signal input and output. The electrode pads 10 are typically made of such a material as aluminum.

The protective film 42 is a nitrided silicon film or the like, which is formed to have openings above the electrode pads 10. The rewiring 30 is made of copper, aluminum, gold, or the like. The rewiring 30 routes signals from the electrode pads 10 to the positions of the solder bumps 20, which are the final positions of formation of the external lead electrodes and connects the same to the posts 48. The columnar posts 48 are made of gold, copper, or the like, and establish electric connection between the solder bumps 20 and the rewiring 30. Incidentally, an insulating layer made of an oxide film, polyimide, or the like may also be formed over the protective film 42, in which case the rewiring 30 is formed thereon.

Return now to FIG. 1. In FIG. 1, the solder bumps 20 are arranged in two rows along the periphery of the semiconductor substrate 40. The electrode pads 10 are arranged inside the outermost solder bumps so as to be interposed between the two rows of solder bumps.

Each of the traces of the rewiring 30 is extended from an electrode pad 10 and is connected to any one of the outermost solder bumps 20 or the inner solder bumps 20.

According to the present embodiment, the outermost solder bumps and the inner solder bumps both can be connected with the electrode pads 10 by approximately the same distances of rewiring. In addition, since the rewiring 30 does not fall outside the outermost solder bumps, the outermost solder bumps can be located close to the edges of the semiconductor substrate 40 without constraints from the layout of the rewiring 30 as far as allowed by the rules of the manufacturing process. It is therefore possible to suppress an increase in chip size.

Second Embodiment

The semiconductor device 100 according to this second embodiment is characterized by that the solder bumps 20 and the rewiring 30 are arranged systematically. FIGS. 3A to 3C show part of the layout of the electrode pads 10, the solder bumps 20, and the rewiring 30 on the semiconductor device 100 according to the present embodiment.

Each of the areas shown in FIGS. 3A to 3C represents one of four areas 300a to 300d having the same shapes, corresponding to the respective sides of a rectangular, shown by the broken lines in FIG. 3D. In FIG. 3A to FIG. 3C, both the electrode pads 10 and the solder bumps 20 are arranged at regular intervals.

In FIG. 3A and FIG. 3B, the solder bumps 20 are arranged linearly in two parallel rows at regular intervals. The electrode pads 10 are arranged linearly in the area interposed between the two rows of solder bumps. The electrode pads 10 are spaced at approximately ½ the spacing of the solder bumps 20.

With the traces of rewiring 30, the respective electrode pads 10 are connected to outer and inner ones out of the two rows of solder bumps 20 alternately in generally the same distances.

In FIG. 3C, the electrode pads 10 are also arranged linearly in two parallel rows. Each of the electrode pads 10 is connected to a nearest solder bump 20 via a trace of rewiring 30.

According to the present embodiment, the traces of the rewiring 30 can be laid generally straight with a reduction in the wiring length. It is also possible to suppress variations in the wiring lengths to the respective terminals, i.e., in the resistances and inductances of the traces. Besides, the rewiring 30 can be laid in a systematic fashion, except those traces of the rewiring 30 to be connected with the solder bumps 20 at the ends of the linear arrangements.

With the layouts shown in FIG. 3A and FIG. 3B, the electrode pads 10 can be arranged linearly in each single area, and thus into a rectangular configuration in terms of the entire semiconductor device 100. It is therefore possible to enhance the consistency with conventional design patterns.

Furthermore, with the layout shown in FIG. 3C, the distances between the electrode pads 10 and the solder bumps 20 can be made generally identical at every location. This can further reduce variations in the wiring length as compared to the layouts shown in FIG. 3A and FIG. 3B. As a result, it is possible to suppress variations in the circuit characteristics of the semiconductor device 100 regardless of which signals are associated with which electrode pads 10.

In the present embodiment, each individual area shown by the broken lines in FIG. 3D may be sectioned in a different configuration such as two rows by five columns (or five rows by two columns).

Third Embodiment

The semiconductor device 100 according to a third embodiment provides a method of making effective use of the space above a semiconductor integrated circuit, appearing outside the electrode pads 10 in the first and second embodiments.

Figure 4A:
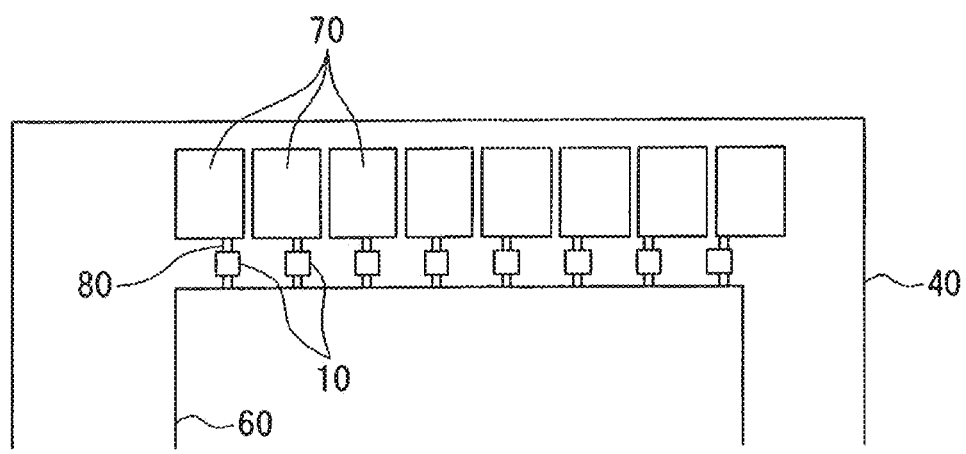
FIG. 4A and FIG. 4B are plan views of part of the semiconductor device according to a third embodiment in a manufacturing phase.
Figure 4B:
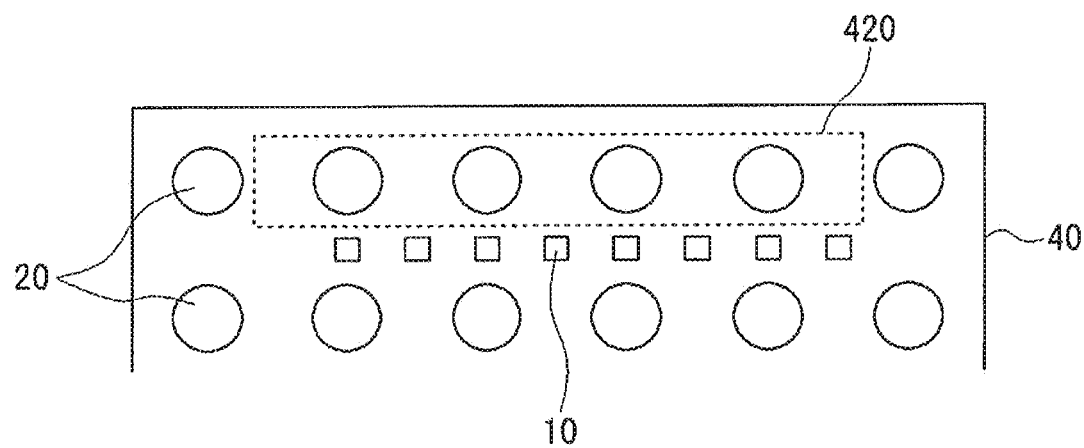
Figure 5:
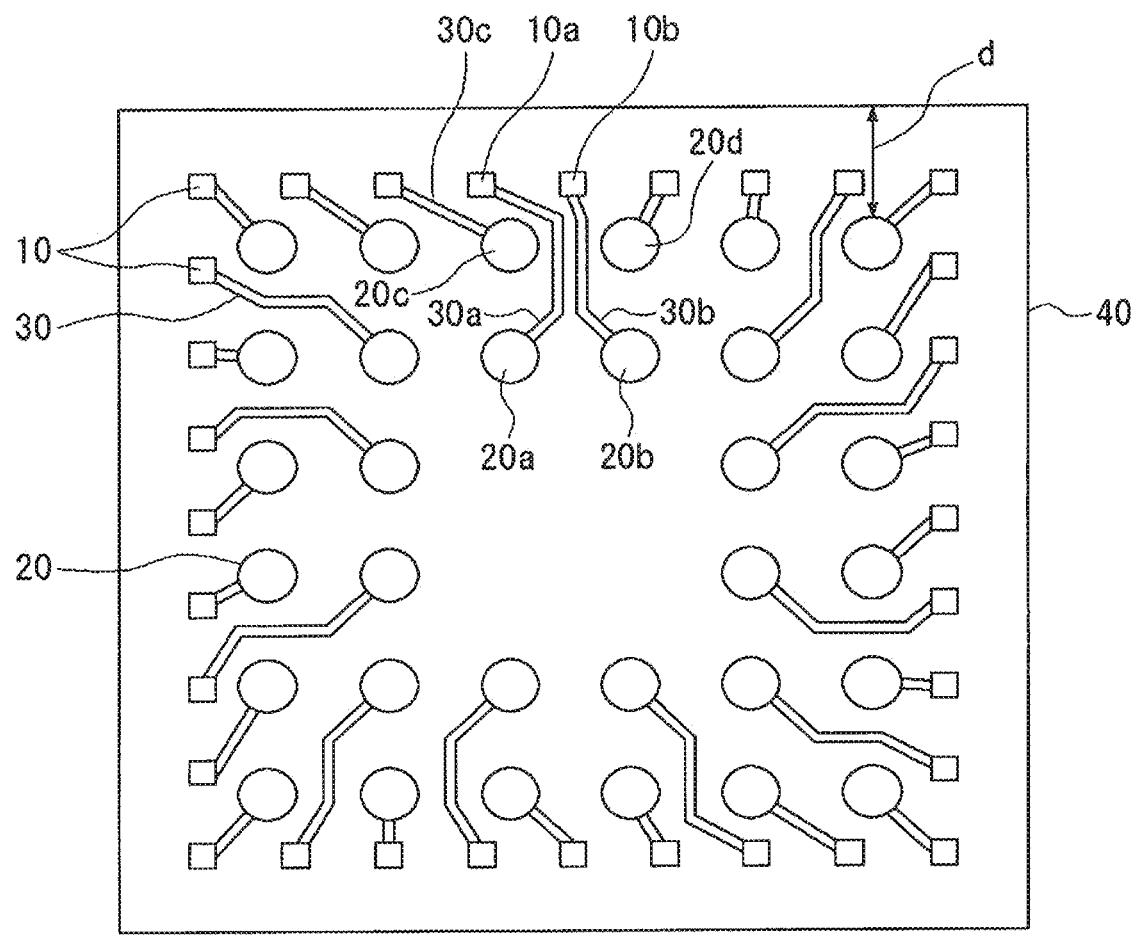
FIG. 5 shows an example of the layout of electrode pads and solder bumps on a semiconductor device having a CSP structure, explaining the problem of the present invention.

FIG. 4A and FIG. 4B are plan views of part of the semiconductor device 100 according to the third embodiment, showing the layouts before and after packaging, respectively. As shown in FIG. 4A, before packaging, a semiconductor integrated circuit including the electrode pads 10, a functional circuit 60, and input/output circuits 70 is formed on the top of the semiconductor substrate 40. The electrode pads 10, the functional circuit 60, and the input/output circuits 70 are connected by ordinary wiring 80 inside the semiconductor integrated circuit.

The functional circuit 60 is a functional block for performing signal processing in the semiconductor integrated circuit. The functional circuit 60 varies in configuration and in area depending on its design.

On the other hand, the input/output circuits 70 are circuit blocks to be connected with the electrode pads 10 for inputting and outputting signals. The input/output circuits 70 include diodes, capacitors, and other protection circuits for protecting the internal circuit elements, and input/output buffer circuits. These protective elements and input/output buffers are composed of basic blocks which have transistors, diodes, capacitors, and other elements arranged in a predetermined configuration, with almost fixed sizes.

As shown in FIG. 4B, since the electrode pads 10 are arranged inside the outermost solder bumps 20, space 420 appears in the peripheral area of the semiconductor substrate 40. This space 420 is utilized to arrange the input/output circuits 70. In the present embodiment, it is desirable to estimate the amount of space to appear outside the electrode pads 10 before designing each input/output circuit 70 into a shape to fit in this space.

According to the present embodiment, the input/output circuits 70 are disposed to the space 420 above the semiconductor integrated circuit, appearing outside the electrode pads 10. This makes it possible to reduce variations ascribable to the rewiring and decrease the chip size of the semiconductor device 100.

Moreover, when the semiconductor device 100 is redesigned to change the function or size of the functional circuit 60, the layout of the electrode pads 10, the solder bumps 20, and the rewiring 30 can be used intact to shrink the design period.

In digital circuits, it is often the case that the circuit block constituting each single unit, such as a gate array, has a fixed circuit configuration and a fixed size. Then, such circuit blocks may be disposed to the peripheral space 420 instead of the input/output circuits 70.

The foregoing embodiments have been given solely by way of example. It will be understood by those skilled in the art that various modifications may be made to combinations of the foregoing components and processes, and all such modifications are also intended to fall within the scope of the present invention.

The embodiments have dealt with the cases where the solder bumps are arranged in two rows along the periphery of the semiconductor device 100. This is not restrictive, however. For example, the solder bumps may be arranged in two rows along each of two opposite sides out of the four sides of the semiconductor device 100. In this case, electrode pads can be arranged in the area interposed between the two rows on each side. The embodiments may be applied to one of the four sides alone.

Moreover, even when solder bumps are arranged in any arbitrary configuration, such as a matrix of four rows by eight columns and a matrix of eight rows by eight columns, the effects of the present invention can be obtained by grouping the solder bumps in two rows and arranging electrode pads therebetween.

Furthermore, the semiconductor device 100 may be configured so that external connection is established via the posts 48 alone, without the formation of the solder bumps 20. An alloy layer may also be formed between the posts 48 and the solder bumps 20, or between the posts 48 and the rewiring 30, for the sake of preferable electric and physical connection properties.

The embodiments are applicable to any of analog circuits, digital circuits, and analog-digital hybrid circuits.

While the preferred embodiments of the present invention have been described using specific terms, such description is for illustrative purposes only, and it is to be understood that changes and variations may be made without departing from the spirit or scope of the appended claims.

What is claimed is:

1. A semiconductor device comprising:
    a semiconductor substrate having an integrated circuit formed thereon;
    a first plurality of electrode pads, including a first electrode pad, a second electrode pad, a third electrode pad and a fourth electrode pad, wherein the first electrode pad, the second electrode pad, the third electrode pad and the fourth electrode pad are four different electrode pads;
    a first group of electrodes that are formed in a first line and includes a first electrode and a second electrode; and
    a second group of electrodes that are formed in a second line and includes a third electrode and fourth electrode, the second line being further from an outermost periphery of the semiconductor substrate and closer to a center of the semiconductor substrate than the first line when viewed along a direction orthogonal to a top surface of the semiconductor substrate, wherein the first electrode, the second electrode, the third electrode, and the fourth electrode are four different electrodes,
    wherein the first plurality of electrode pads is arranged between the first group of electrodes and the second group of electrodes when viewed along the direction orthogonal to the top surface of the semiconductor substrate,
    wherein the first electrode pad is electrically connected by a first metal connection to the first electrode, the second electrode pad is electrically connected by a second metal connection to the second electrode, the third electrode pad is electrically connected by a third metal connection to the third electrode, and the fourth electrode pad is electrically connected by a fourth metal connection to the fourth electrode;
    wherein the first plurality of electrode pads, the first group of electrodes, and the second group of electrodes are arranged such that a first electrical distance from the center of the first electrode pad to the center of the first electrode is substantially equal to a third electrical distance from the center of the third electrode pad to the center of the third electrode, and a second electrical distance from the center of the second electrode pad to the center of the second electrode is substantially equal to a fourth electrical distance from the center of the fourth electrode pad to the center of the fourth electrode, and
    wherein the first plurality of electrode pads is equal in size.

2. The semiconductor device according to claim 1, further comprising an insulating film formed over the semiconductor substrate.

3. The semiconductor device according to claim 2, wherein the first plurality of electrode pads is made of aluminum, copper, or gold.

4. The semiconductor device according to claim 1, wherein first electrode and the second electrode are equal in size.

5. The semiconductor device according to claim 4, wherein are of the third electrode and the fourth electrode are equal in size.

6. The semiconductor device according to claim 5, wherein a first direction extending from the center of the second electrode pad to the center of the second electrode is not parallel with four edges of the semiconductor substrate in a plan view.

7. The semiconductor device according to claim 6, wherein a second direction extending from the center of the fourth electrode pad to the center of the fourth electrode is not parallel with the four edges of the semiconductor substrate in a plan view.

8. The semiconductor device according to claim 7, wherein the first direction and the second direction are approximately parallel.

9. The semiconductor device according to claim 8, wherein the semiconductor device is one of the analog circuit devices, digital circuit device, or analog/digital mixed circuit device.

10. The semiconductor device according to claim 9, wherein the semiconductor device is a wafer level CSP device.

11. The semiconductor device according to claim 10, further comprising a wiring formed on the insulating film.

12. The semiconductor device according to claim 11, wherein the wiring is made of aluminum, copper, or gold.

13. The semiconductor device according to claim 12, further comprising an input/output circuit to be connected to the first plurality of electrode pads, being arranged on the outermost periphery of the semiconductor device, and a functional circuit arranged near the center of the semiconductor substrate; and the first plurality of electrode pads are arranged between the input/output circuit and the functional circuit.

14. The semiconductor device according to claim 12, wherein the first line of the first group of electrodes extends substantially to the periphery of the semiconductor substrate.

15. The semiconductor device according to claim 12, wherein the first electrical distance, the second electrical distance, the third electrical distance and the fourth electrical distance are substantially equal.

16. The semiconductor device according to claim 12, wherein the first electrical distance and the second electrical distance are not substantially equal to the third electrical distance and the fourth electrical distance.

17. The semiconductor device according to claim 12, wherein the first group of electrodes has a minimum spacing generally equivalent to an integral multiple of a minimum spacing of the first plurality of electrode pads, and the second group of electrodes has a minimum spacing generally equivalent to an integral multiple of a minimum spacing of the first plurality of electrode pads.

18. The semiconductor device according to claim 12, wherein the first and second groups of electrodes are arranged systematically at same intervals.

\* \* \* \* \*